(12) United States Patent
Bouchez et al.

(10) Patent No.: US 9,733,291 B2
(45) Date of Patent: Aug. 15, 2017

(54) DETECTION OF A LEAKAGE CURRENT COMPRISING A CONTINUOUS COMPONENT IN A VEHICLE

(71) Applicant: Valeo Systemes de Controle Moteur, Cergy Saint Christophe (FR)

(72) Inventors: Boris Bouchez, Cergy (FR); Pierre Sardat, Le Raincy (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 236 days.

(21) Appl. No.: 14/380,942

(22) PCT Filed: Feb. 28, 2013

(86) PCT No.: PCT/FR2013/050416
§ 371 (c)(1),
(2) Date: Aug. 26, 2014

(87) PCT Pub. No.: WO2013/128128
PCT Pub. Date: Sep. 6, 2013

(65) Prior Publication Data
US 2015/0022153 A1    Jan. 22, 2015

(30) Foreign Application Priority Data

Feb. 29, 2012   (FR) .................................... 12 51824

(51) Int. Cl.
G06F 17/50    (2006.01)
G01R 31/00    (2006.01)
(Continued)

(52) U.S. Cl.
CPC .......... G01R 31/006 (2013.01); B60L 3/0069 (2013.01); B60L 3/0092 (2013.01);
(Continued)

(58) Field of Classification Search
CPC ............. H02J 5/005; H02J 7/025; H02J 3/005
(Continued)

(56) References Cited

U.S. PATENT DOCUMENTS

2004/0001292 A1   1/2004 Vanderkolk
2011/0148355 A1*  6/2011 Nakamura et al. ........... 320/109
(Continued)

FOREIGN PATENT DOCUMENTS

DE   2 300 802 A1   7/1974
EP   2 284 549 A1   2/2011
(Continued)

OTHER PUBLICATIONS

International Search Report for corresponding International Application No. PCT/FR2013/050416, mailed Apr. 26, 2013 (3 pages).

*Primary Examiner* — Suchin Parihar
(74) *Attorney, Agent, or Firm* — Osha Liang LLP

(57) ABSTRACT

The invention relates to a device for detecting a leakage current, comprising means (124) for measuring a current from an electrical circuit of a vehicle, in particular a motor vehicle, said detection device being configured to be placed on board said vehicle and being such that the measuring means (124) comprise: a magnetic core (128) configured to be passed through by one or a plurality of conductive elements (127) traversed by the current from the electrical circuit, said conductive element(s) (127) forming a primary winding; a secondary winding (130), wound around the core (128), to generate a magnetic flux from a reference current; and an oscillator (132) for generating the reference current though the secondary winding (130), the reference current being configured to saturate said core (128). According to the invention, the value of the current of the primary winding (127) is obtained from the average value of the current at the secondary winding (130) over a period of oscillation covering a complete core (128) magnetization
(Continued)

Figure 1:
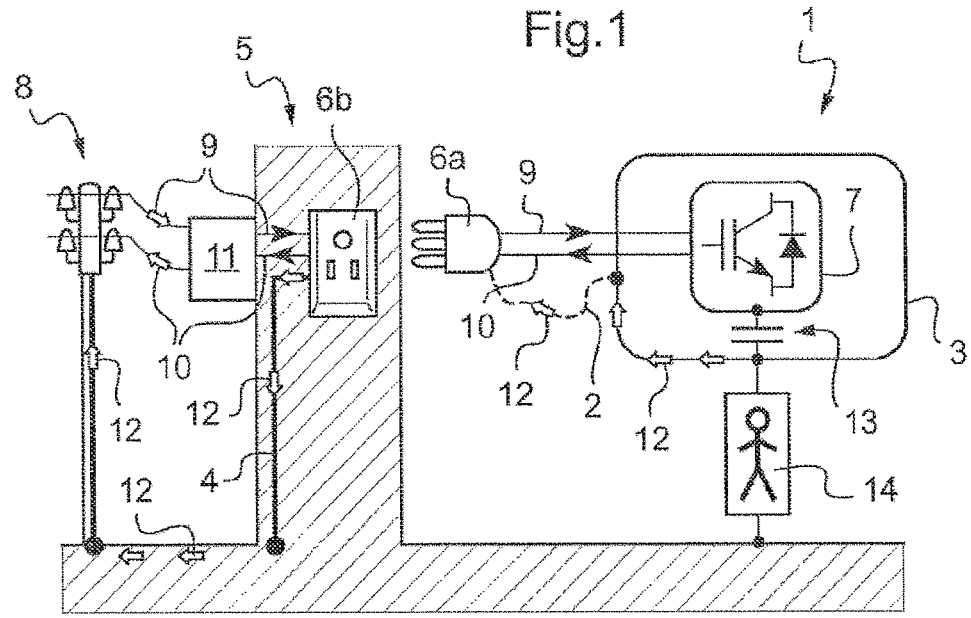

and demagnetization cycle. The invention also relates to various on-board systems using said device.

16 Claims, 10 Drawing Sheets

(51) Int. Cl.
| | |
|---|---|
| *B60L 3/00* | (2006.01) |
| *H02H 3/16* | (2006.01) |
| *B60L 11/18* | (2006.01) |
| *G01R 27/02* | (2006.01) |
| *H02J 7/00* | (2006.01) |
| *G01R 15/18* | (2006.01) |
| *G01R 27/18* | (2006.01) |

(52) U.S. Cl.
CPC ....... *B60L 11/1809* (2013.01); *B60L 11/1816* (2013.01); *G01R 27/02* (2013.01); *H02H 3/162* (2013.01); *H02J 7/0036* (2013.01); *G01R 15/185* (2013.01); *G01R 27/18* (2013.01); *H02J 2007/0039* (2013.01); *Y02T 10/7005* (2013.01); *Y02T 10/7072* (2013.01); *Y02T 90/14* (2013.01)

(58) Field of Classification Search
USPC ........................................................ 320/109
See application file for complete search history.

(56) References Cited

U.S. PATENT DOCUMENTS

| | | | |
|---|---|---|---|
| 2013/0099731 A1* | 4/2013 | Schaefer ....................... | 320/108 |
| 2014/0009299 A1* | 1/2014 | Fahrenkrug et al. ......... | 340/664 |
| 2014/0091759 A1* | 4/2014 | Kagawa et al. .............. | 320/109 |
| 2014/0176163 A1* | 6/2014 | Ripoll et al. ................. | 324/705 |

FOREIGN PATENT DOCUMENTS

| | | |
|---|---|---|
| EP | 2 384 922 A2 | 11/2011 |
| FR | 2 752 059 A1 | 2/1998 |
| FR | 2 921 769 A1 | 4/2009 |
| WO | 2005/114805 A2 | 12/2005 |
| WO | 2010/112251 A1 | 10/2010 |
| WO | 2012/052366 A1 | 4/2012 |
| WO | 2012/136336 A2 | 10/2012 |

\* cited by examiner

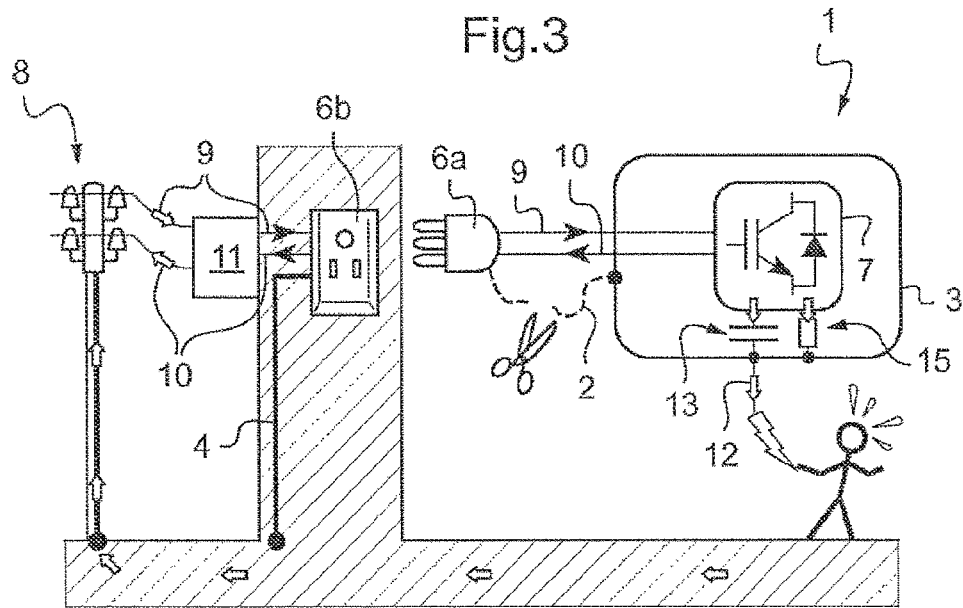
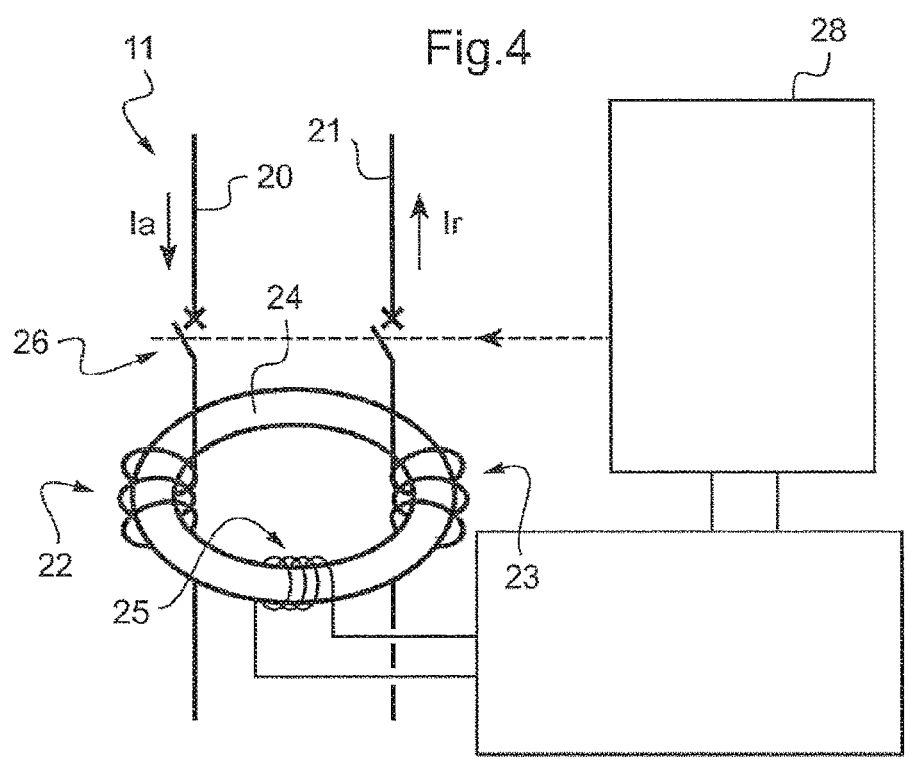

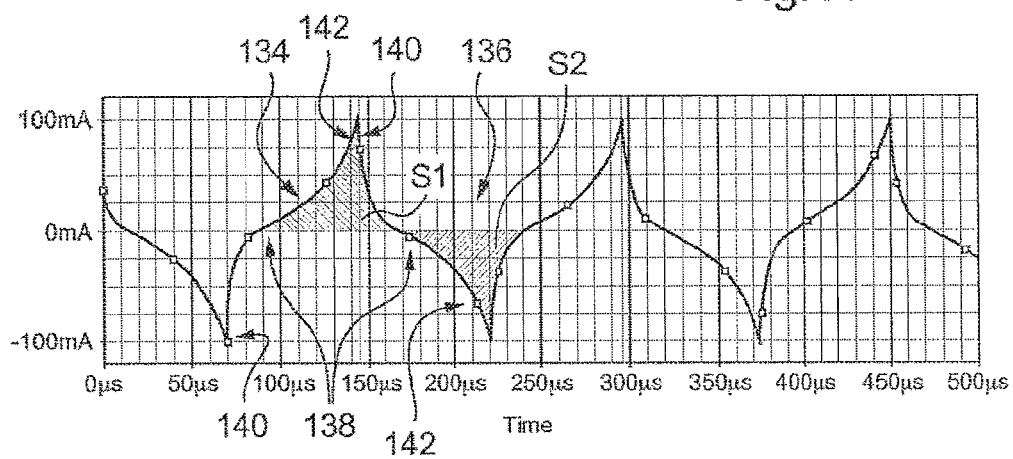
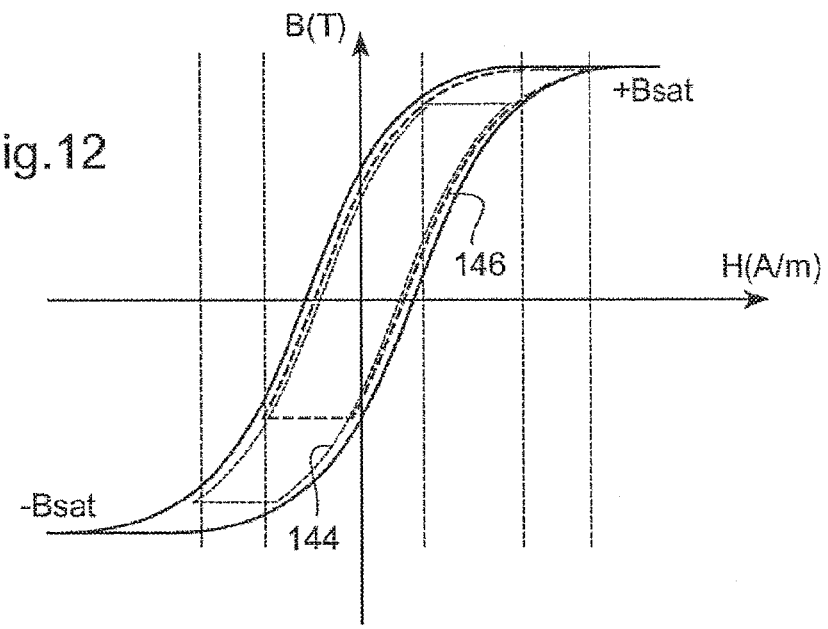

DETECTION OF A LEAKAGE CURRENT COMPRISING A CONTINUOUS COMPONENT IN A VEHICLE

The present invention relates to a device for detecting a leakage current, installed in a vehicle. The invention also relates to an electric system for protecting the charging of a battery installed in the vehicle and to a system for measuring a ground impedance of a domestic installation serving to charge said battery, these systems comprising such a device for detecting a leakage current.

The invention also relates to a system for charging said battery comprising such an electric protection system and/or such a system for measuring ground impedance. The invention also relates to a vehicle comprising such a system for charging the battery.

More particularly, the invention relates to the field of electric or hybrid vehicles. In such vehicles, an electric motor, generally a three-phase motor, serves to drive the vehicle or at least participates in this process. The motor is supplied by a battery, which requires recharging periodically.

It is known to recharge the battery with the aid of a fixed installation for providing current, such as a domestic electric circuit supplied with alternating current. The vehicle is connected to the installation, and a circuit installed in the vehicle makes it possible to recharge the battery, in particular with the aid of a rectifier.

The installed electric circuit may be the source of leakage currents, in particular by means of parasitic components arranged between the circuit and the chassis of the vehicle. Such leakage currents could pass through an impedance placed between the chassis and ground, such as a person touching the body of the vehicle when the person's feet are in contact with the floor. The same problem may also be encountered if the body of the vehicle is touched by one hand and a metal fitting of the dwelling is touched with the other hand. The consequences of such a phenomenon on the organism are more or less severe and could range from a simple uncomfortable sensation to electrocution.

Figure 2:
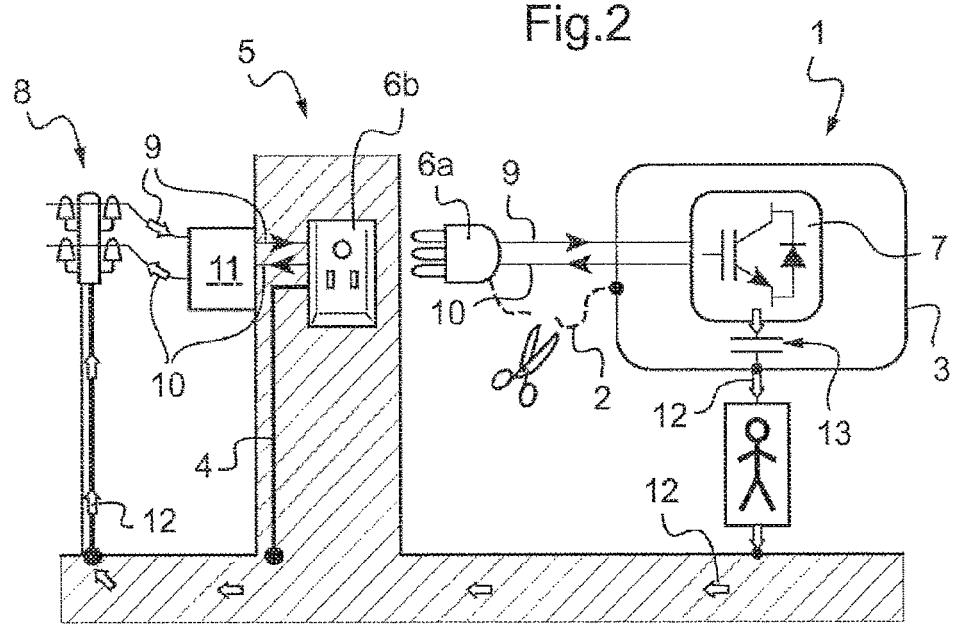

As illustrated in FIGS. 1 to 3, it is known in order to limit this risk to equip the vehicle 1 with a grounding conductor 2 making it possible, by means of an electric connector 6a, 6b, to connect the chassis 3 of the vehicle 1 to a cable 4 for grounding a domestic electric installation 5.

In these figures, a circulation of current through an electric grid 8, the domestic electric installation 5 and an electric circuit 7 of the vehicle is illustrated by arrows 9, 10, here in a phase/neutral configuration. A residual-current circuit breaker 11 is provided between the supply grid 8 and the domestic electric installation 5. The purpose of said circuit breaker is to detect leakage current and to interrupt the power supply in the event of danger.

In FIG. 1, a leakage current is present, illustrated by the arrows 12. The leakage current typically comprises a parasitic component due to design that is primarily alternating and a default component that may comprise an alternating and/or continuous signal. The default component corresponds to an unwanted event that causes an insulation fault.

The leakage current reaches the chassis 3 by means of a parasitic capacitor 13 or capacitors used for purposes of electromagnetic compatibility. The grounding conductor 2 is operational here and the leakage current preferably returns from the chassis 3 of the vehicle to the domestic installation via said grounding cable 4. Irrespective of the triggering of the residual-current circuit breaker 11, the risks that some of the leakage current will pass through a person 14 coming into contact with the chassis, thus injuring this person, are therefore limited.

In FIG. 2, the same leakage current is present, but the grounding conductor is faulty. Here, it has been cut. In this hypothesis, the leakage current passes through the person 14 upon contact with the chassis, however the consequences of such a fault remain limited if the residual-current circuit breaker 11 is operational. In fact, this circuit breaker interrupts the power supply if the fixed thresholds for triggering of said circuit breaker are reached, typically 30 mA for alternating currents at a frequency of 50 Hz for the standards currently in force. The person 14, upon contact with the chassis 3, risks experiencing the passage of the leakage current, but the triggering of the operational circuit breaker will prevent him from sustaining any severe bodily injury.

In FIG. 3, a leakage current is still present. By contrast with the previous cases, where said leakage current was assumed to have a zero mean, it has a continuous component this time. Said leakage current reaches the chassis by means of the parasitic capacitor and a parasitic resistor 15. The presence of a continuous component is particularly dangerous because it causes the majority of residual-current circuit breakers 11 present in current domestic electric installations to fail. In such a case, if the grounding conductor 2 is also faulty, the leakage currents pass through the person 14 upon contact with the chassis 3 without this person being protected by the residual-current circuit breaker 11 because said circuit breaker is no longer able to be activated. An electrocution could then be sustained.

In addition, the protection of the entirety of the domestic electric installation 5 is affected. In fact, because the residual-current circuit breaker 11 is faulty, a leakage current interfering with any electric apparatus of the installation will no longer be detectable. All the occupants of the dwelling normally protected by said residual-current circuit breaker 11 are thus placed in danger.

The source of the problem encountered with the residual-current circuit breakers considered above in the case of the presence of a continuous component will be explained with reference to FIGS. 4, 5 and 6.

FIG. 4 schematically illustrates this type of apparatus. The incoming current Ia and outgoing current Ir of the protected installation pass through windings 22, 23 provided along inlet/outlet conductors, here a phase 20 and a neutral 21. Said windings 22, 23 are arranged on the same magnetic toroid 24. They are configured to generate magnetic fluxes of identical intensity, but circulating in the toroid in opposite directions when the current passing via the phase 20 is of the same intensity as the current passing by the neutral 21. A third winding 25 is disposed on the toroid. Said third winding is connected to a disconnection device 26 making it possible to stop the supply with current of the protected installation in the case of the presence of a current exceeding certain thresholds in said third winding 25. More precisely, the third winding 25 is connected to a circuit 27 supplying an electromagnet 28, which is provided in order to trigger the opening of the disconnection device 26 depending on the current circulating in the circuit 27.

As long as the current circulating in the phase 20 is identical to the current circulating in the neutral 21, the fluxes induced by the windings 22, 23 in the toroid are permanently cancelled and no variation of flux occurs in the toroid 24. There is thus no current generated by the third winding 25, and the power supply of the protected installation is assured.

By contrast, in the case of the presence of a leakage current, the currents circulating in the conductors 20, 21 are no longer identical and a variation of flux occurs in the toroid 24, which triggers the circulation of a current in the circuit 27. The intensity of the leakage current corresponds to the amplitude of the difference between phase current and neutral current, the latter corresponding to an amplitude of variation of flux in the toroid and thus to an intensity of current circulating in the circuit 27, the latter possibly actuating the disconnection device 26 by means of the electromagnet 28 depending on said intensity.

Figure 5:
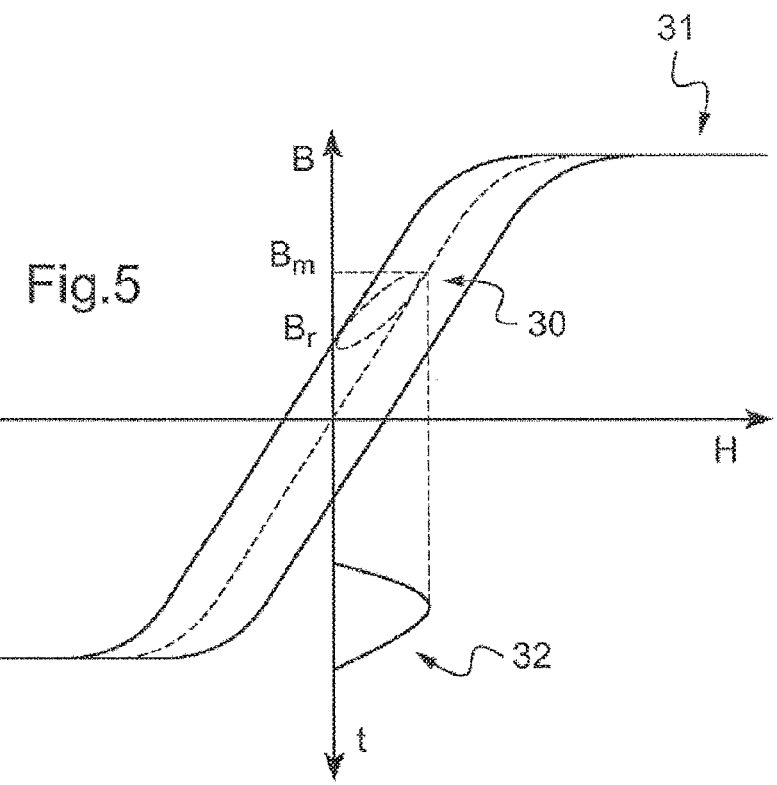
Figure 6:
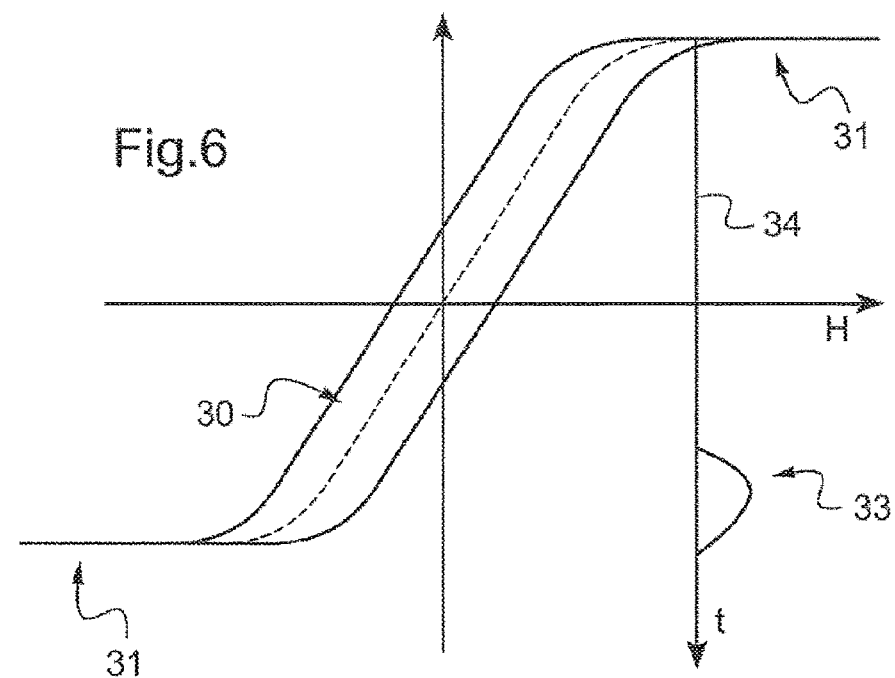

FIGS. 5 and 6 illustrate the effect of the presence of a continuous component in a leakage current on the variation of flux generated by a magnetic toroid as considered above. These figures show the conventional magnetization curve of the materials forming such toroids. The intensity H of magnetic excitation (measured in A/m or Oersted) is given along the abscissa and the density B of magnetic flux (measured in Tesla or Gauss) or induction is illustrated along the ordinate. The magnetization curve gives the value of the induction generated as a function of the magnetic excitation, the latter being dependent on the current passing through the conductor generating the field. As is known, the magnetic materials used have a hysteresis cycle 30 and above all zones of saturation 31 for which a variation of magnetic excitation corresponds to a very weak variation of the induction.

FIG. 5 shows a profile 32 of magnetic excitation corresponding to the effects of a leakage current, here of the half-wave type (the ordinate serves as a time axis). Such an excitation causes a variation of induction between a maximum value Bm and a value Br corresponding to the remanent induction of the material. In such a case, the leakage current thus causes a variation of flux $\Delta B$ in the magnetic toroid, and the residual-current circuit breaker may function in a nominal manner. Here, $\Delta B = Bn - Br$ is sufficiently large to allow a detection.

FIG. 6 shows another profile 33 of magnetic excitation caused by a leakage current still of the half-wave type, but this time comprising a continuous component (an axis 34 parallel to the ordinate serves as a time axis). Due to said continuous component, the magnetic excitation is located in a zone for which the material saturates, and it can be seen that the variations of magnetic excitation added to the continuous component no longer cause any variation or cause very small variations of induction. Here, $\Delta B = Bn - Br$ is too low to allow a detection. In such a case, the continuous component of the current, by saturating the magnetic material, prevents any variation of flux and thus causes the residual-current circuit breaker equipped with said toroid to fail. For the magnetic materials commonly used in the residual-current circuit breakers, it is believed that a current having a continuous component of more than 6 mA is not admissible in accordance with the standards currently in force.

The risks of appearance of a continuous component of stronger intensity in the currents originating from the circuits equipping the electric vehicles are not insignificant, in particular due to the presence of step-up voltage converters, in particular having a power factor correction (PFC) function, used to recharge the battery.

Figure 7:
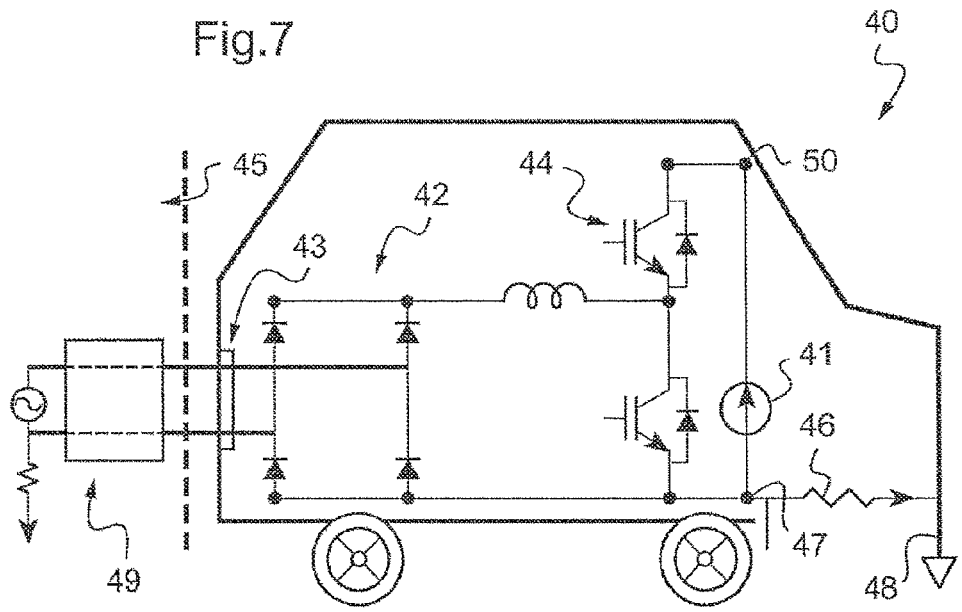
Figure 8:
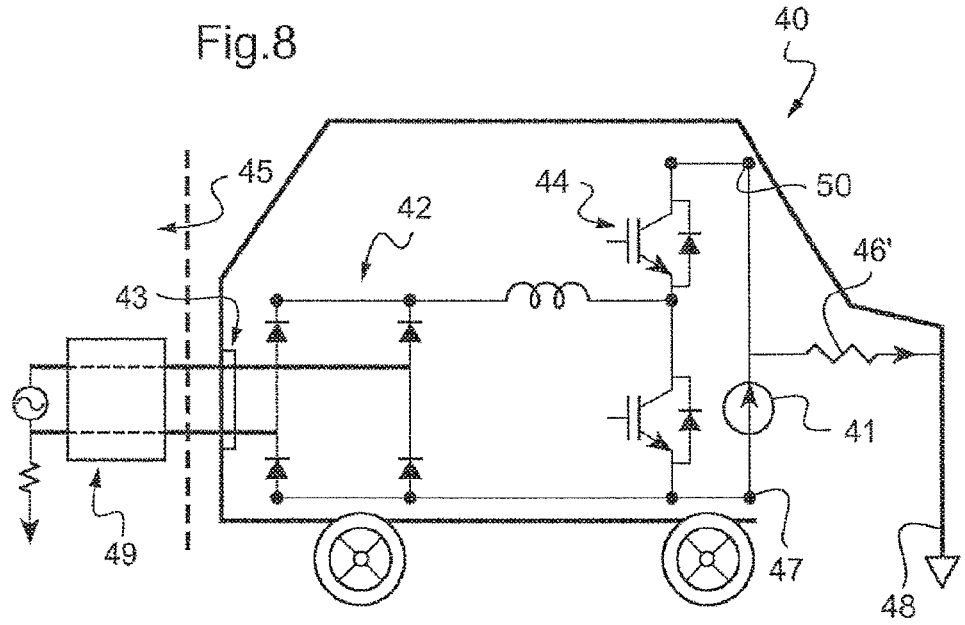

Such a risk is detailed in FIGS. 7 and 8, which schematically illustrate a vehicle 40 equipped with a circuit for charging a battery 41 comprising a bridge rectifier 42, connected to a charging connector 43, and a converter 44, which is a voltage step-up converter and possibly a power factor corrector. The charging connector is intended to be connected to a domestic electric installation 45 delivering an alternating current, protected by a residual-current circuit breaker 49. The presence of a leakage current is represented by a leakage resistor 46, 46'.

In FIG. 7, the leakage current circulates between the ground 47 of the circuit and the chassis 48 of the vehicle. In such a hypothesis, the leakage current varies with the alternations of the current delivered by the domestic electric installation through the bridge rectifier 42. There is no continuous component in the leakage current and the residual-current circuit breaker 49 is operational.

In FIG. 8, the leakage current is produced between the positive terminal 50 of the battery 41 and the chassis 48 of the vehicle. The leakage current thus comprises a continuous component originating from the voltage supplied by the battery, the continuous component then being found in the leakage current, and the residual-current circuit breaker 49 is no longer operational if said continuous component is too high.

A first solution for avoiding the risks that could endanger such circuit breakers would be to equip the domestic electric installation with a circuit breaker that is electrically more robust. Such circuit breakers, referred to as class B circuit breakers, are known. However, they are rarely used to protect domestic installations. They are very expensive, however the risks of appearance (other than during charging) of a continuous component above the standards in a domestic network are very low.

In addition, the users of a vehicle are not necessarily able to check whether the domestic electric installation into which they wish to plug is equipped with such a circuit breaker. Certain individuals, by ignorance of the risk or forced by need, could decide anyway to connect their vehicle to an installation not equipped with the appropriate circuit breaker.

It can also be noted that it appears to be of little relevance commercially to require a potential purchaser of an electric vehicle to change his electric installation if he wants to be able to recharge his vehicle from his home. This would severely hamper the distribution of this vehicle type.

The object of the invention is to overcome these difficulties and to this end to propose a device for detecting a leakage current, for example alternating and/or continuous, comprising means for measuring a current from an electric circuit of a vehicle, in particular a motor vehicle, said detection device being configured to be installed in said vehicle.

Such a device makes it possible to detect a leakage current on the basis of the only means present in the vehicle. In a specific application, the device makes it possible to know whether there is a risk of sending to the domestic electric installation to which the vehicle is connected a current having an excessively high continuous component without having to depend on external equipment. The user of the vehicle thus no longer needs to know if the electric installation to which he is connecting is compatible.

In accordance with different embodiments of the invention, which could be considered together or separately:
- the measuring means comprise means for generating a magnetic flux based on from said circuit;
- the means for generating magnetic flux comprise a magnetic toroid configured to be passed through by a magnetic flux originating from the current from said circuit;
- said means for generating magnetic flux comprise a secondary winding, wound around said toroid, for generating a magnetic flux based on a reference current; and said magnetic toroid is configured to be passed through by one or more conductive elements through which said current from the electric circuit is passed, said conductive element or said conductive elements forming a primary winding;

the measuring means comprise an oscillator for generating the reference current through the secondary winding, the reference current being configured to saturate said toroid;

the measuring means further comprise means for protecting the functioning of the oscillator;

the measuring means comprise
an integrator/comparator module configured to deliver a current, referred to as the image of the current at the primary winding, which is dependent on the current from the circuit, and
means for compensating for the flux generated by the current from the electric circuit based on the current delivered by said module;

the flux compensation means comprise a third winding wound around said toroid, and wherein an output of said integrator/comparator module is connected to said third winding such that said third winding is passed through by said current that is the image of the current at the primary winding;

the flux compensation means are formed by said secondary winding, and wherein an output of said integrator/comparator module is connected to said secondary winding such that said secondary winding is passed through by said current that is the image of the current at the primary winding;

said measuring means comprise a resistor, referred to as a parameterizing resistor, having a first terminal connected to the secondary winding and to the oscillator and a second terminal connected to an output terminal of the device and to the integrator/comparator module so as to adjust the output characteristics of the device and the characteristics of the oscillator;

said measuring means comprise a resistor, referred to as an adjusting resistor, having a first terminal connected to the secondary winding and to the oscillator and a second terminal connected to a ground of said device so as to adjust the characteristics of the oscillator;

said measuring means comprising a resistor, referred to as a measuring resistor, having a first terminal connected to the secondary winding and a second terminal connected to an output terminal of the device and to the integrator/comparator module so as to adjust the output characteristics of the device;

the measuring means comprise means for filtering said current that is the image of the current at the primary winding, thus making it possible to obtain a signal having a profile substantially identical to that of the current from the electric circuit;

the measuring means comprise means for adjusting the voltage range at the output of the filter module;

the device comprises a generator of fictitious ground, said measuring means being connected to said fictitious ground;

said oscillator and/or said generator of fictitious ground and/or said integrator/comparator module comprise at least one respective operational amplifier;

said operational amplifier is such that its transition time is less than 50 ns;

said operational amplifier is connected at the output to a current amplifier.

The invention also relates to a device for detecting a leakage current comprising means for measuring a current from an electric circuit of a vehicle, in particular a motor vehicle, said detection device being configured to be installed in said vehicle and being such that the measuring means comprise:

a magnetic toroid configured to be passed through by one or more conductive elements through which said current from the electric circuit is passed, said conductive element or said conductive elements forming a primary winding;

a secondary winding, wound around said toroid, for generating a magnetic flux based on a reference current;

an oscillator for generating the reference current through the secondary winding, the reference current being configured to saturate said toroid;

and wherein the value of the current of the primary winding is obtained based on the mean value of the current at the secondary winding over a period of oscillation covering a complete toroid magnetization and demagnetization cycle.

The detection device may have any one of the features described above.

The invention also relates to an electric system for protecting the charging of a battery installed in a vehicle, in particular a motor vehicle, comprising a device for detecting a leakage current according to the invention.

Said protection device comprises, for example, control means making it possible to make a circuit serving to charge said battery operate in a degraded mode.

The invention also relates to a system for measuring a ground impedance of a domestic installation serving to charge a battery of a motor vehicle, said measuring system comprising a device for detecting a leakage current according to the invention.

The invention also relates to a system for charging a battery installed in a vehicle comprising such an electric protection system and/or such a system for measuring ground impedance.

The different systems considered above are configured to be installed in a vehicle, and the invention further relates to a vehicle comprising said detection device and/or one or more of said systems.

By equipping the vehicle with electric protection systems utilizing the measurements obtained by said detection device, it is possible to avoid endangering individuals passing close to the vehicle as well as the occupants of the dwelling to which the vehicle is connected. These individuals will in fact be protected by the residual-current circuit breaker of the dwelling, whatever its type. Said detection device could have further applications, such as allowing the checking of the ground impedance of the domestic installation to which it is connected.

The invention lastly relates to a method for charging a battery, in particular a vehicle battery, comprising;

the provision of a charging system according to the invention;

the charging of the battery with a power factor correction by means of said charging system;

the continuance of the charging without the power factor correction when a ratio between a continuous component of the leakage current and an alternating component of this leakage current is greater than a predetermined threshold.

Figure 9:
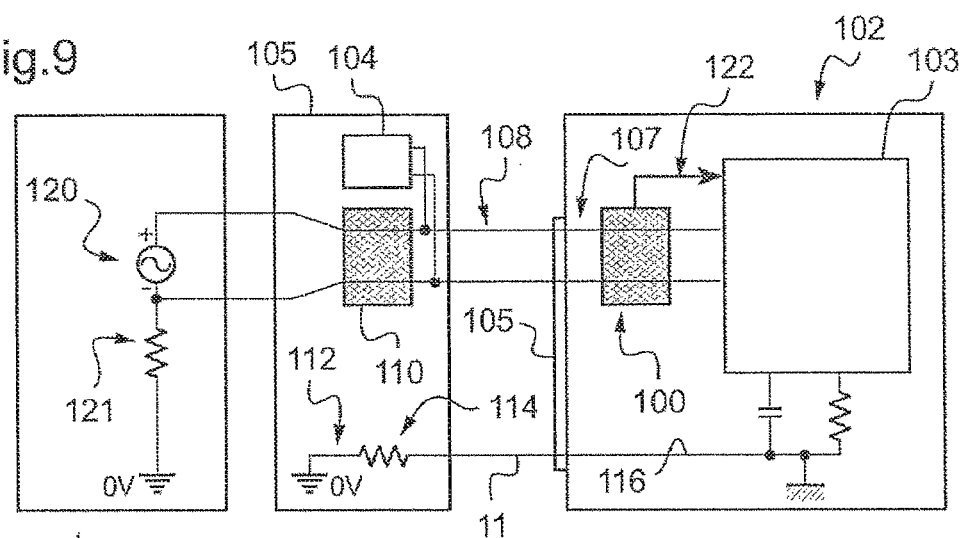
Figure 10:
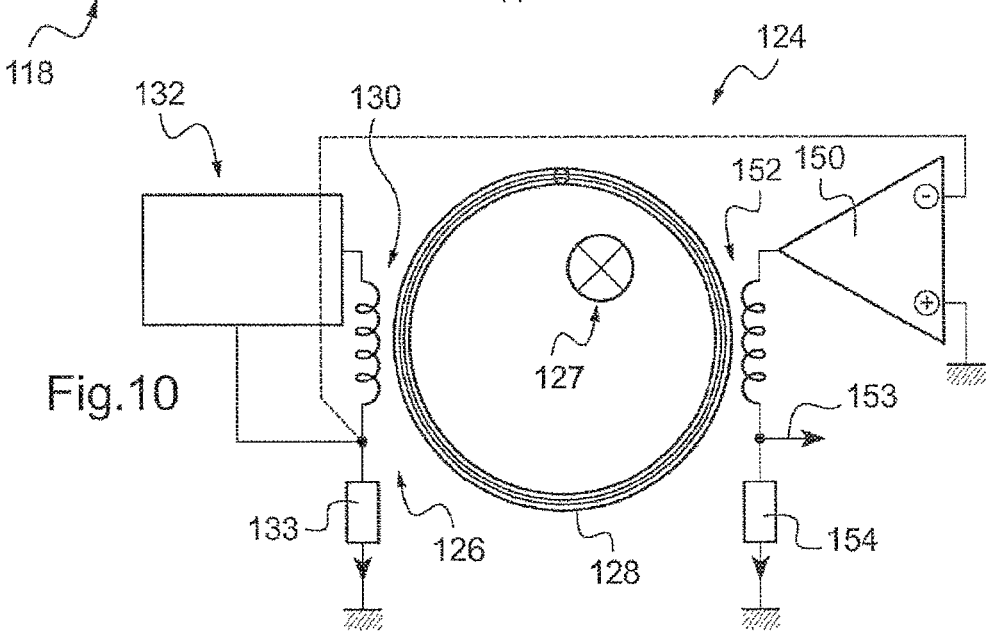
Figure 18:
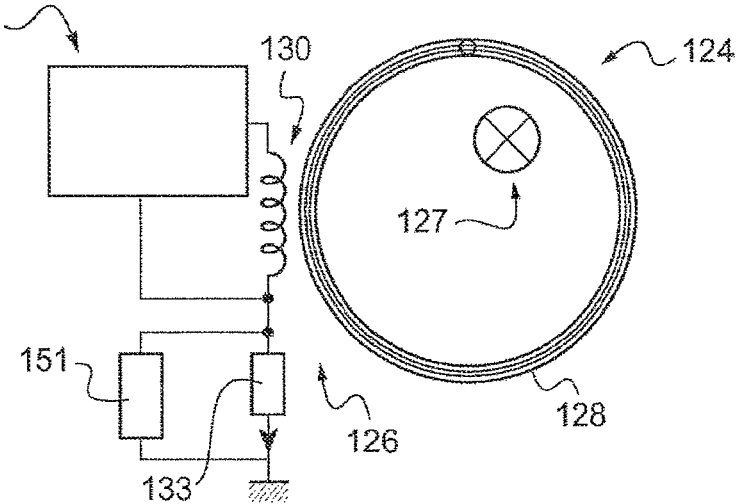
Figure 13:
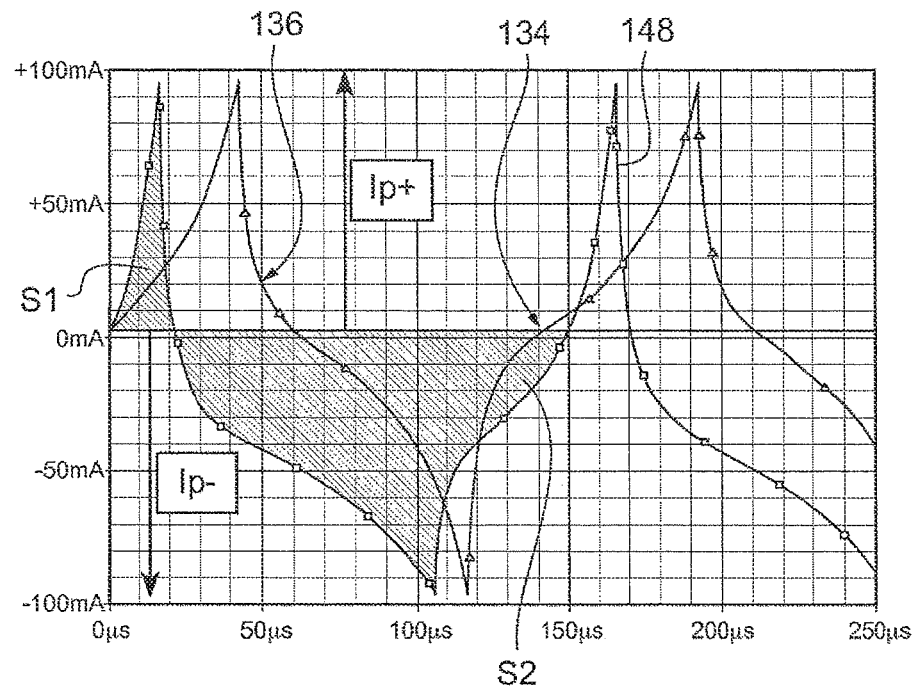
Figure 14:
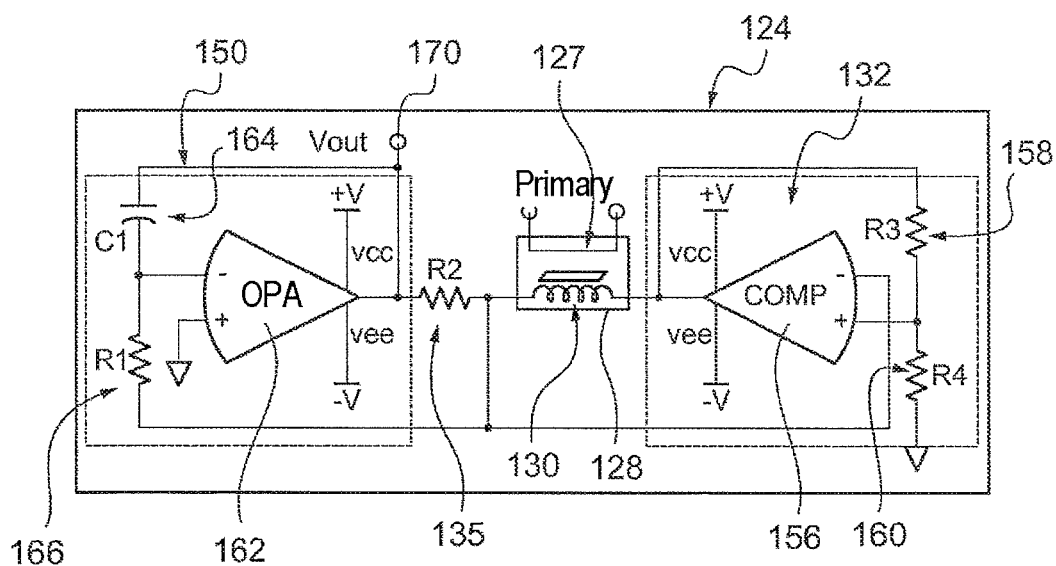
Figure 15:
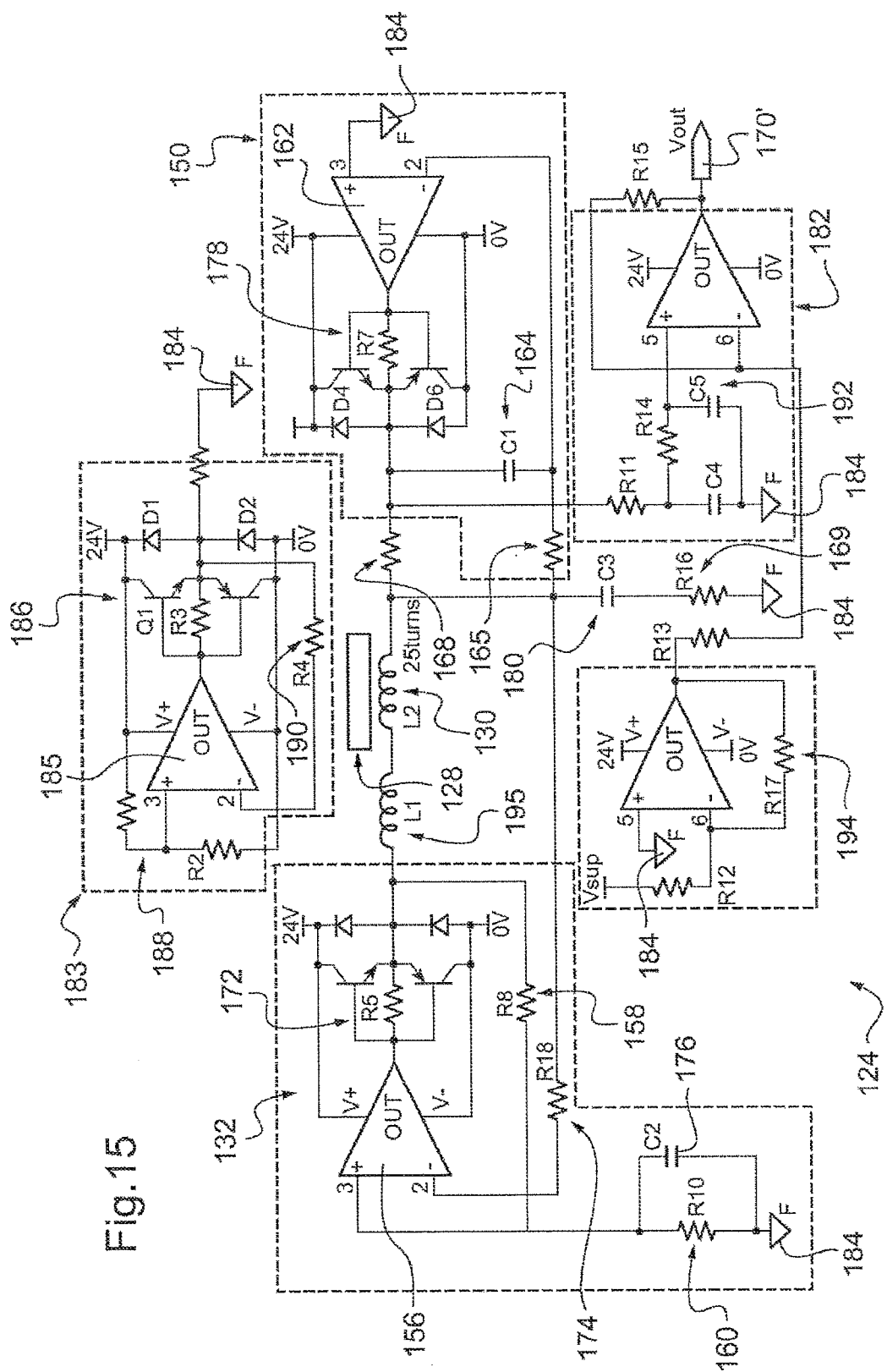
Figure 16:
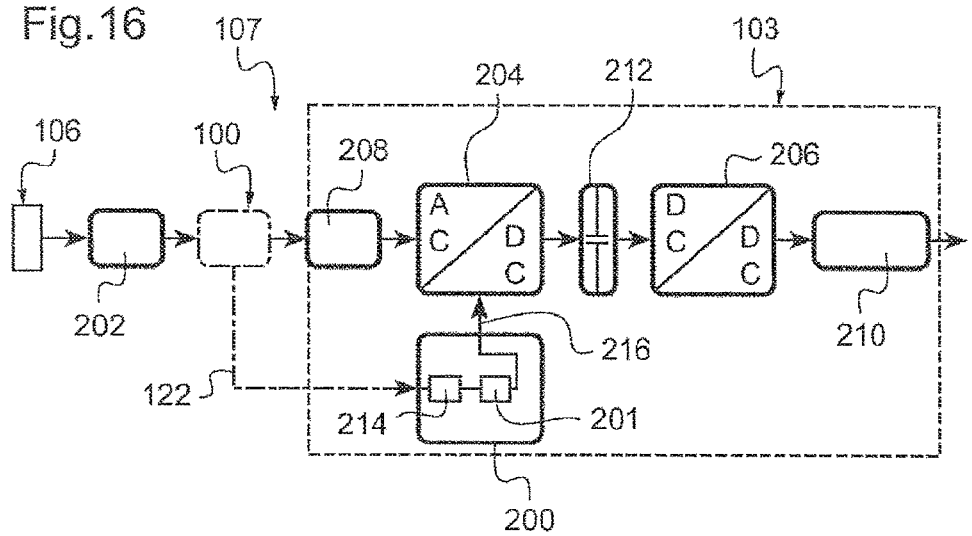
Figure 17A:
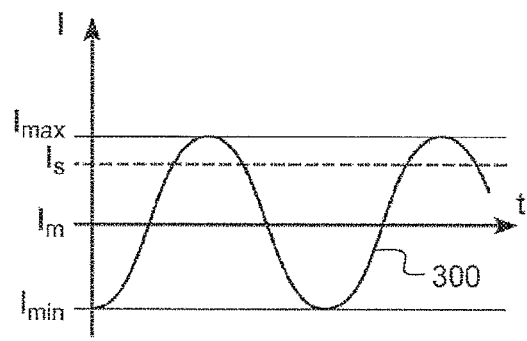
Figure 17B:
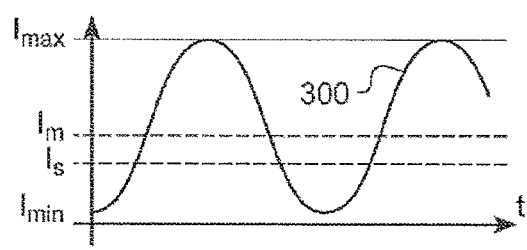
Figure 17C:
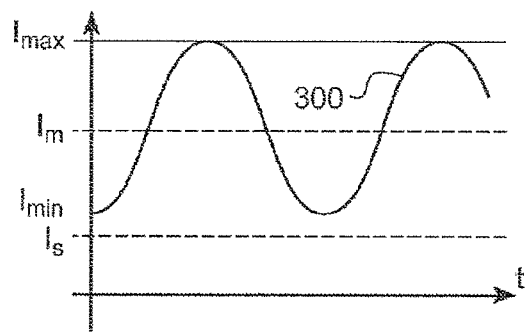
Figure 19:
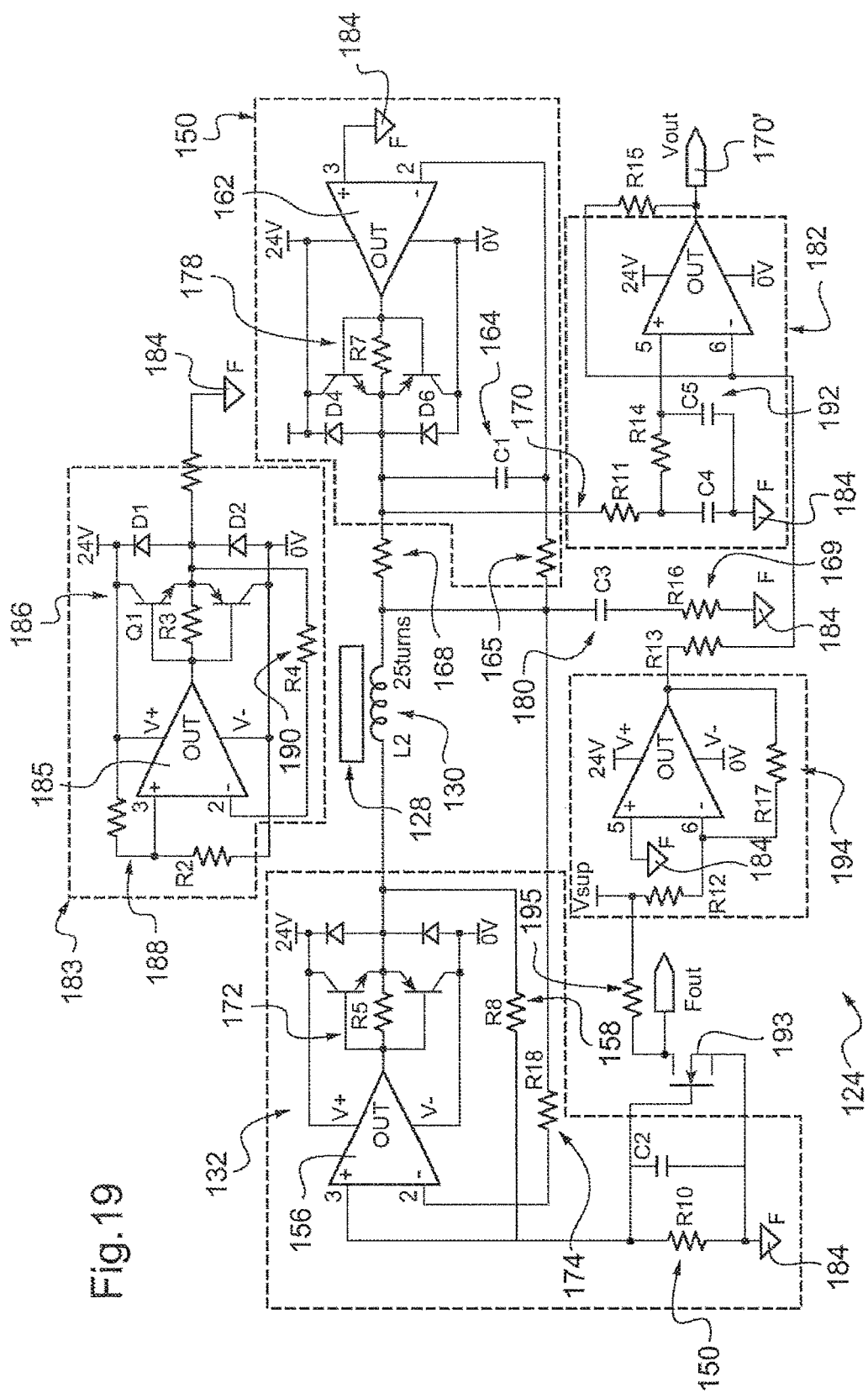

Embodiments of the invention will now be described in greater detail, but in a non-limiting manner, with reference to the accompanying drawings, in which:

FIGS. 1 to 3, already discussed, schematically illustrate the risks associated with the recharging of batteries of an electric vehicle of the prior art, FIG. 4, already discussed, schematically illustrates a residual-current circuit breaker of the prior art, FIGS. 5 and 6, already discussed, show magnetization curves with the objective of illustrating the effect of a current having a continuous component across the residual-current circuit breakers of the type shown in FIG. 4, FIGS. 7 and 8, already discussed, schematically illustrate a vehicle of the prior art equipped with a device for charging a battery with the objective of illustrating the risks of appearance of a leakage current having a continuous component, FIG. 9 schematically illustrates a vehicle equipped with a detection device according to the invention, FIG. 10 schematically illustrates a first exemplary embodiment of the detection device according to the invention for the purpose of measuring a continuous component in a current at the primary winding, FIG. 11 illustrates a curve showing, as a function of time, the variation of a current circulating in said device in the absence of a continuous component in the primary circuit, FIG. 12 is a magnetization curve illustrating the functioning of said device in the presence and in the absence of a continuous component in the current at the primary winding, FIG. 13 resumes FIG. 11 in order to compare the curves obtained in the presence and in the absence of a continuous component in the current at the primary winding, FIG. 14 schematically illustrates a second embodiment of the detection device according to the invention, FIG. 15 schematically illustrates a third exemplary embodiment of the detection device according to the invention, FIG. 16 schematically illustrates an electric system for protecting the charging of a battery according to the invention, FIGS. 17a to 17c, in the form of time graphs, show different current profiles in relation to the invention, FIG. 18 schematically illustrates another exemplary embodiment of the detection device according to the invention, and FIG. 19 schematically illustrates a fourth exemplary embodiment of the detection device according to the invention.

As illustrated in FIG. 9, the invention relates to a device 100 for detecting a leakage current configured to be installed in a vehicle 102. In particular, the vehicle, particularly a motor vehicle, could be an electrically driven vehicle, that is to say a vehicle comprising an electric motor providing the traction and/or the propulsion of the vehicle, possibly by being coupled to a heat engine. In other words, it could just as well be what is known as an electric vehicle or what is known as a hybrid vehicle. Said electric motor is supplied by a battery (not shown) installed in said vehicle 102.

Said vehicle 102 comprises an electric circuit 103 serving in particular to recharge said battery. Said circuit 103 could be, as illustrated, a circuit supplied in a single phase or polyphase, in particular three-phase, manner. The circuit is connected here to a domestic electric installation 104 of a dwelling 105 by m a connection terminal 106 of the vehicle 102. A supply line 107 is provided between said circuit 103 and said connection terminal 106. Said protection device is situated on the supply line 107. An electric cable 108 could be used to connect said connection terminal 106 to said domestic installation 104.

Said dwelling 105 comprises a residual-current circuit breaker 110 protecting said domestic installation 104. The dwelling also comprises a grounding cable 112 having a grounding impedance symbolized by the resistor 114. The connection terminal 106 is configured to connect a grounding conductor 116 of the vehicle (here the ground is the chassis of the vehicle) to a grounding conductor of the cable 108, connected to said grounding impedance 114.

Said dwelling 105 is supplied by a network 118 conventionally comprising a voltage source 120, in particular of low alternating voltage. The electric domestic installation 104 is connected to the network by m the residual-current circuit breaker 110. Said network 118 comprises its own grounding impedance 121.

Said detection device 100 is configured to be connected to a control unit of the electric circuit 103 of the vehicle, in particular by m a cable 122.

As illustrated in FIG. 10, said detection device comprises means 124 for measuring a current generated by the electric circuit of the vehicle.

Said measuring means 124 comprise, for example, means 126 for generating a magnetic flux based on the current generated by the electric circuit.

For example, the current circulates in a conductive element 127 of said electric circuit 103 of the vehicle. This could be, for example, the phase or the neutral of the supply line 107 of the circuit 103. In normal mode, said conductive element 127 is intended to be passed through by an alternating current. In the event of an anomaly, it could also be passed though by leakage currents, which may be alternating and/or continuous.

As an equivalent, the current may correspond to the sum resulting from currents circulating in a number of different conductive elements 127. In particular in a single-phase installation, the current is the result of currents circulating in the phase and the neutral of the supply line 107.

Said means 126 for generating magnetic flux comprise, in particular, a magnetic toroid 128 configured to be passed through by a magnetic flux originating from the current circulating in said conductive element 127.

Said magnetic toroid 128 is formed, for example, by a magnetic material having a maximum relative permeability μr between 5000 and 150000, in particular of approximately 15000 and/or a coercive field Hc between 1 and 3 A/m. In particular, it could be made of ferrite or amorphous materials.

The toroid 128 is configured to be passed through by said conductive element 127, forming a primary winding. In other words, said primary winding 127 comprises one turn. This means that the magnetic toroid 128 is configured so that said primary winding passes in a rectilinear manner through said toroid 128.

Said means 126 for generating the magnetic flux comprise a secondary winding 130, wound around said toroid 128, for generating a magnetic flux passing through said toroid based on a reference current.

Said measuring means 124 further comprise, for example, an oscillator 132 generating said reference current through the secondary winding. Said oscillator is connected here on the one hand to a first terminal of the secondary winding 128 and on the other hand to a second terminal of said secondary winding 128, a resistor 133 of said measuring means 124 being connected to said second terminal. Said resistor 133 is arranged between said second terminal and ground. The oscillator 132 generates, for example, a voltage of the square wave type assuming alternately the two values +Vmax and −Vmax. The oscillator is configured here to pass from +Vmax to −Vmax and vice versa as soon as a maximum or a minimum of current Ip+ or Ip− in the secondary winding 130 is reached. The resistor 133 makes it possible to adjust the oscillations delivered to the second winding 130, in particular the values of peak current Ip+ or Ip− of the second winding 130.

Said measuring means 124, in particular said oscillator 132 and said secondary winding 130 are configured to saturate said toroid 128 under the action of the peak current.

With reference to FIG. 11, the form of the current passing through the secondary winding 130 under the effect of the voltage delivered by such an oscillator 132 will be described. In this figure, the intensity of the current is illustrated on the ordinate and the time is illustrated on the abscissa. In response to the square wave voltage signal delivered by the oscillator, the current in the secondary winding 130 has rising phases 134 and falling phases 136 alternating with one another.

In an intermediate part 138 of each of said rising and falling phases 134, 136, the current generated in the secondary winding 130 corresponds to a non-saturated state of the toroid 128. In these intermediate parts, the current rises or decreases relatively slowly. In the start 140 or end 142 parts of each of said rising and falling phases 134, 136, the current generated in the secondary winding corresponds by contrast to a saturated state of the magnetic toroid 128 and the current rises or decreases relatively quickly.

The cycle corresponding to magnetization and demagnetization of the toroid 128 is illustrated in FIG. 12 in the case of the presence or absence of a current circulating in the primary winding.

The curve illustrated by a solid line is the maximum magnetization curve.

The curve 144 illustrated by dots corresponds to the case in which there is no current circulating in the primary winding. In this case, it can be seen that the extreme values of the induction correspond to saturation zones of the material. It can also be seen that the extreme values are equal in terms of absolute value. This is reflected on the curve of FIG. 11 by extreme values Ip+, Ip− of current circulating in the secondary winding that are also equal in terms of absolute value and are of opposed sign. This is also reflected by an equality of the surfaces S1 and S2, situated respectively between the abscissa and the positive part of the rising and falling phases 134, 136 and between the abscissa and the negative part of the rising and falling phases 134, 136, that is to say by a mean zero value of the current circulating in said secondary winding.

The curve 146 illustrated by dashes corresponds to the case in which a current is introduced into the primary winding. Compared with the curve 144, the curve 146 is offset toward the positive values of induction, as shown. The level of saturation of the magnetic material is greater in the positive values than in the negative values when the primary current generates a positive magnetomotive field.

Conversely, the level of saturation of the magnetic material is greater in the negative values than in the positive values when the primary current generates a negative magnetomotive field. In this case, compared with the curve 144, the curve 146 would be offset toward the negative values of induction.

In other words, the presence of a current in the primary winding 127 modifies the magnetic state of the toroid 128, which drives a modification of the cycle of magnetization and of demagnetization of the toroid 128 and of the current at the secondary winding.

FIG. 13 illustrates the curve 148 showing the intensity of the current in the secondary winding 130 as a function of time in the case of a positive magnetomotive field.

The rising and falling phases 134, 136 of the curve 138 in the case of the absence of current circulating in the primary winding have also been shown in order to facilitate the comparisons.

In the curve 148, it is possible to see the dissymmetry of the curve 146 of magnetization and demagnetization. The speeds of progression of the current at the secondary winding are much higher in the positive part than in the negative part because saturation is better in the positive part than in the negative part. This makes it possible to explain the difference between the surfaces S1, S2 of the positive and negative parts. In other words, the mean value of the current circulating in the secondary winding is no longer zero. This mean value is dependent on the current that circulates in the primary winding.

Consequently, when the current of the primary winding varies, the mean value of the current at the secondary winding varies proportionally over a period of oscillation. Thus, by observing the current at the secondary winding, it is possible to return to the value of the current in the primary winding. A solution making it possible to demonstrate the presence of the current circulating in the primary winding and even to quantify the value thereof is thus provided. In addition, thanks to the means 126 for generating magnetic flux, a measurement of the current in the primary winding is obtained whilst having a galvanic separation between the circuit 103 of the vehicle and the circuit implemented for the measurement.

It is preferable for the values of current at the secondary winding 130 to make it possible to reach a saturation of the toroid 128. FIGS. 12 and 13 illustrate the benefit of the saturation of the toroid. It can be seen in fact that, thanks to this phenomenon, the amplitude of variation of induction changes significantly depending on the level of current passing in the primary winding. The precision of the measurement can thus be improved.

To ensure a good level of saturation of the magnetic material, it is necessary for the current circulating in the secondary winding to be sufficiently high. For example, the maximum current in absolute value circulating in said secondary winding is approximately 100 mA with a good saturation of the toroid 128.

In addition, the current circulating in the primary winding may be of variable type. For example, the current may have a frequency of 50 Hz. So that the frequency of the oscillator makes it possible to obtain measurements of this current circulating in the primary winding, it is necessary for the frequency of this oscillator to be much greater than that of the current circulating in said primary winding, in particular at least 10 times greater, for example 100 times greater. This makes it possible to reconstruct the current at the primary winding in a manner sufficiently faithful for utilization thereof. The frequency of the oscillator 132 can be between 1 and 20 kHz. In particular, the frequency of the oscillator 132 can be 7 kHz in order to allow the measurement of a current of frequency 50 Hz at the primary winding. In other words, it is sought to reproduce the waveform of the current at the primary winding 127 with, for example, an error of 5 to 10% on the peak values.

Advantageous results have been obtained in this sense by selecting, for the secondary winding 130, a number of turns between 10 and 50 turns, in particular between 20 and 30 turns, for a primary winding having one turn.

However, the primary winding 127 could have more than one turn. The secondary winding 130 then has a corresponding number of turns.

In accordance with a first embodiment, illustrated in FIG. 18, the measuring means 124 comprise digital processing means 151 making it possible to obtain the value of the current circulating in said conductive element 127 from the current circulating in the secondary winding 130. In other words, the value of the current at the secondary winding as presented in FIG. 13 is released directly to a microcontroller or a digital circuit. The value of the current at the primary winding is deduced by a processing of the signal.

However, the device according to this first embodiment gives a less efficient result in terms of linearity with respect to the embodiments that follow. With reference to FIG. 12, it is understood that high values of current at the primary winding 127 bring the curve 146 close to the extreme value +Bsat if the magnetomotive field is positive or close to the extreme value −Bsat if the magnetomotive force generated is negative. This means that, for high values of current at the primary winding, a linear relationship between the current at the primary winding 127 and the value of the current at the secondary winding 130 is no longer guaranteed. In other words, when the toroid 128 is significantly distanced from its neutral magnetic state, corresponding for example to the curve 144 in FIG. 12 or to the curve 138 in FIG. 11, a reliable measurement of the current at the primary winding is no longer assured.

In a second and a third embodiment illustrated in FIGS. 10, 14 and 15, for quantifying the value of the current circulating in the primary winding 127, the measuring means 124 comprise an integrator/comparator module 150 delivering an output current, referred to as the image of the current at the primary winding, which is dependent on the leakage current to be measured.

The module 150 integrates the current originating from the secondary winding 130 and compares its mean value with a zero value. The integrator/comparator module 150 delivers a current that is dependent on the difference between the mean value of the current at the secondary winding 130 with a zero value. To this end, this difference is highly amplified, for example with a gain greater than 70 dB. The module 150 is configured to modify its output current so that the difference is not substantially zero.

The measuring means 124 further comprise means for compensating for the flux generated in the toroid 128 by the current circulating in said conductive element 127 based on the current delivered by said integrator/comparator module 150.

Thus, the toroid 128 is constantly returned to a neutral magnetic state, the mean value of the current at the secondary winding is constantly returned to a zero value and the current delivered by the module 150 corresponds to the current passing through the conductive element 127, in other words to the leakage current to be measured. The module 150 and the flux compensation means define a control loop controlling the magnetic state of the toroid 128.

Said integrator/comparator module 150 is connected to said secondary winding 130. In particular, said integrator/comparator module 150 comprises an inverting input connected to said second terminal of the secondary winding 130, in particular by means of a resistor 166, and a non-inverting input connected to ground.

In accordance with the second embodiment, corresponding to that illustrated in FIG. 10, said compensation means correspond to a third winding 152, wound around said toroid 128. The measuring means are configured in such a way that said third winding 152 generates in the toroid a magnetic flux, referred to as a compensation flux, which is opposed compared with that generated by said primary winding; the compensation flux being generated based on the current delivered by the integrator/comparator module 150.

Said third winding 152 is connected to the output of the integrator/comparator module 150 in such a way that said third winding is passed through by the current that is the image of the current at the primary winding.

For example, the terminal of the third winding 152 opposite that connected to the integrator/comparator module 150, referred to as the output terminal 153, is connected to an output resistor 154, which is turn connected by its opposite terminal to ground. The voltage VOUT at the output terminal is thus equal to the product of the resistance Rs of said output resistor 154 and of the quotient of the intensity of the current Ie circulating in the primary winding 127 by the number of turns N of said third winding 152. The intensity Ie of the current circulating in the primary winding 127 is thus obtained by a simple measurement of the voltage at said output terminal 153.

$$VOUT = Rs \times (Ie/N)$$

The third embodiment is illustrated in FIGS. 14 and 15. In these figures, the toroid 128 is illustrated schematically. It will also be noted that the primary winding has not been illustrated in FIG. 15.

In this third embodiment, said compensation means correspond to the secondary winding 130. An output of the integrator/comparator module 150 is connected to the secondary winding 130 and said measuring means 124 are configured so that the integrator/comparator module 150 generates a current circulating in the secondary winding 130 so as to compensate for the flux generated by the primary winding 127. In other words, in this embodiment, the magnetic flux generated in the toroid 128 by the current circulating in the primary winding 127 is no longer compensated for by a flux generated by a current passing through a third coil. The measuring means 124 are configured so that the compensation flux is generated directly by a compensation current passing through the secondary winding 130. In this embodiment, it is therefore not necessary to use a third winding 152.

In FIGS. 14 and 15 it can be seen that the oscillator 132 comprises an operational amplifier 156 and a voltage divider bridge comprising two resistors 158, 160. The middle point of said voltage divider is connected to the non-inverting input of said operational amplifier 156. The output of the operational amplifier 156, the terminal of one 158 of the resistors opposite the middle point of said voltage divider and one of the terminals of the second winding 130 are at the same potential. The other 160 of the resistors of said voltage divider bridge is connected to ground.

The integrator/comparator module 150 comprises an operational amplifier 162 and a bridge RC comprising a capacitor 164 and a resistor 166. The non-inverting input of said operational amplifier 162 is connected to ground. Its inverting input is connected to the middle point of the bridge RC.

In a variant illustrated in FIG. 14, the measuring means 124 comprise a resistor 135, referred to as a parameterizing resistor. One of the terminals of said measuring resistor is placed at the same potential as the inverting input of the operational amplifier 156 of the oscillator 132, the terminal of the secondary winding 130 opposite that connected to the output of said operational amplifier 156 of the oscillator 132, and the terminal of the resistor 166 of the bridge RC opposite the middle point of said bridge RC. The other of the terminals of said measuring resistor 135 is placed at the same potential as the output of said operational amplifier 162 of the integrator/comparator module 150, the terminal of the capacitor 164 of the bridge RC opposite the middle point of said bridge RC, and an output point 170.

In accordance with this variant, said measuring resistor 135 plays a double role.

The resistor 135 makes it possible to parameterize the oscillator 132, in particular the peak values Ip+, Ip− of the current at the secondary winding 130.

In addition, the resistor 135 connects the second winding 130 to the output of the integrator/comparator module 150 for the circulation of the compensating current. Said measuring resistor 135 serves as an output resistor in the sense of the configuration of the embodiment of FIG. 11. A voltage measurement at the output point 170 will give the value of the current circulating in the primary winding 127.

However, because the resistor 135 can take only a single value, it must respect a compromise between the specifications of the oscillator 132 and those associated with the measurement of the voltage at the output point 170. The variant illustrated in FIG. 15 makes it possible to overcome this problem.

In accordance with the variant illustrated in FIG. 15, the measuring means 124 comprise a resistor 169, referred to as an adjusting resistor, placed between a terminal of the secondary winding 130, arranged between said secondary winding and said oscillator 132, and a ground of said device. The adjusting resistor 169 makes it possible to adapt the characteristics of the oscillator 132, in particular with a view to assuring the saturation of the toroid 128. The capacitor 180 makes it possible to eliminate a continuous component in the current delivered to the adjusting resistor 169. Thus, the adjusting resistor 169 only receives the oscillating current determined by the oscillator 132.

The measuring means 124 further comprise a resistor 168, referred to as a measuring resistor, which serves as an output resistor in the sense of the configuration of the embodiment of FIG. 11.

The functions of the resistor of the oscillator and also of the conductor serving to establish the compensation current are thus separated without having to add a third winding, as in FIG. 10.

It should be noted that FIG. 15 shows a developed circuit diagram compared with FIG. 14, which shows a semi-developed circuit diagram. Some elements of the variant illustrated in FIG. 15 can be integrated in a similar manner in the variant in FIG. 14, in particular a current amplifier 172 and a resistor 174 of the oscillator 132, and a current amplifier 178 of the integrator/comparator module 150, as well as a filter module 182, means 194 making it possible to adjust the voltage range of the output signal, a generator 183 of fictitious ground 184, and means 193, 195, 196 for protecting the functioning of the oscillator.

The output of the operational amplifier 156 of the oscillator 132 is connected for example to an input of the current amplifier 172. The output of said current amplifier 172, the terminal of one 158 of the resistors opposite the middle point of said voltage divider, and one of the terminals of the second winding 130 are at the same potential.

The oscillator 132 may comprise the resistor 174, of which the first terminal is connected to the inverting input of the operational amplifier 156 of said oscillator 132.

The output of the operational amplifier 162 of the integrator/comparator module 150 is connected, for example, to an input of the current amplifier 178. One of the terminals of said measuring resistor 168 is placed at the same potential as the output of said current amplifier 178, the terminal of the capacitor 164 of the bridge RC of the integrator/comparator module 150 opposite the middle point of said bridge RC, and the output point 170.

The other terminal of the measuring resistor 168 is placed at the same potential as a second terminal of the resistor 174, the terminal of the secondary winding 130 opposite that connected to the output of said current amplifier 152 of the oscillator 132, and the terminal of the resistor 166 of the bridge RC of the integrator/comparator module 150 opposite the middle point of said bridge RC. This terminal is also at the same potential as one of the terminals of the adjusting resistor 169, here by means of a capacitor 180.

Thanks to the different circuits described above, the presence and even the level of a current at the primary winding can thus be determined.

In this respect, said measuring means could further comprise a filter module 182, connecting the output point 170 to a voltage measurement point 170'. Said filter module 182 is configured to eliminate from the signal the undulations originating from the oscillator 132. At terminals of a capacitor 192 of said filter module 182, a signal is thus obtained, in particular a voltage, having a profile substantially identical to that of the current circulating in the conductive element 127.

To facilitate the processing of said signal, the measuring means could further comprise means 194 making it possible to adjust the voltage range of the signal available at the output point 170' of the device. For example, the adjustment means 194 are configured so that the output voltage is a positive voltage range determined on the basis of a power supply Vsup. This facilitates a subsequent processing of the output signal, for example by a control unit. For example, a current at the primary winding of −100 mA corresponds to an output voltage Vout of 0 V; a current at the primary winding of 0 mA corresponds to an output voltage Vout of value $$\frac{Vsup}{2};$$

and a current at the primary winding of 100 mA corresponds to an output voltage Vout of value Vsup. In the case in which the output signal Vout is then processed by a control unit, the power supply Vsup may correspond to the power supply of this control unit.

Different means could also be used to make the measurement more reliable, in particular by assuring that a current is obtained that is as symmetrical as possible in the secondary winding 130 in the case of the absence of current circulating in the primary winding 127. This means a current for which the surfaces S1 and S2 considered above are as close as possible, with minimum error, in particular error of the offset type.

To this end, said detection device 100 may comprise a generator 183 of fictitious ground 184, said measuring means 124 being connected to said fictitious ground 184.

More precisely, the resistor 160 of the voltage divider bridge of said oscillator 132, the adjusting resistor 169 and/or the inverting input of the operational amplifier 162 of the integrator/comparator module 150 could be connected to said fictitious ground 184. The objective of the generator 183 of fictitious ground is to generate two symmetrical power supplies having values that are as identical as possible in order to limit to the maximum the dissymmetries of amplitude of the oscillator influencing the offset of the measurement.

Said generator of fictitious ground 184 comprises an operational amplifier 185 of which the output is connected to said fictitious ground by a current amplifier 186. Said generator of fictitious ground 184 further comprises a voltage divider bridge 188 of which the middle point is connected to the non-inverting input of the operational amplifier 185. The ends of the voltage divider bridge and also the current amplifier are connected to a voltage supply source, in particular between 0 and 24 V. Said generator of fictitious ground also comprises a resistor 190 placed between the fictitious ground and the inverting input of said operational amplifier 185.

Another solution contributing to assuring that a current is obtained in the secondary winding that is as symmetrical as possible in the case of the absence of current circulating in the primary winding lies in the use of current amplifiers 172, 178, 186 at the output of the operational amplifiers 156, 162, 185 of the measuring means and/or of the generator of fictitious ground. It is thus possible to select precise operational amplifiers whilst still of limited cost because there is less current to deliver. By the same token, said current amplifiers 172, 178, 186 comprise bipolar transistors, for example.

Still with the objective of obtaining a current in the secondary winding that is as symmetrical as possible in the case of the absence of current circulating in the primary winding, the operational amplifier or the operational amplifiers 156, 162, 185 of the measuring means and/or of the generator of fictitious ground could be selected so as to assure the transition times between the values +Vmax and −Vmax of their output voltage that are below 50 ns. This is the case in particular for the operational amplifier 156 of the oscillator 132. A temporal dissymmetry is thus prevented from being passed on to the generated signals illustrated in FIG. 11.

In accordance with a variant of all the embodiments of the detection device 100, the measuring means 124 further comprise means 193, 195, 196 for protecting the functioning of the oscillator 132.

When the current at the primary winding is very high, the toroid 128 permanently saturates severely, which leads to a rise of the frequency of the oscillator 132. A very high current at the primary winding is approximately 1 A, even 10 A, for example. The frequency of the oscillator 132 can then be so high that the integrator/comparator module 150 is likely to be unable to process the signal delivered by the oscillator. A severe saturation of the toroid 128 may even lead to the cessation of the oscillations. This leads to an instability of the detection device 100. The output voltage Vout then no longer corresponds with certainty to the current at the primary winding. There is a risk that the output voltage gives an underestimated value of the current at the primary winding, which may affect the electric safety of the vehicle.

The protection means 193, 195, 196 control the frequency of the oscillator 132 so as to assure that the oscillator functions correctly.

For example, the protection means consist of an inductor 196 in series between the oscillator 132 and the secondary winding 130. The inductor 196 is not wound in the toroid 128 and is therefore substantially independent of the magnetic state of the toroid. The inductor 196 assures that the oscillator 132 oscillates even when the current at the primary winding is very high. The inductor 196 then replaces the secondary winding 130, which is too saturated, and determines the frequency of the oscillator 132. For example, the inductor 196 assures a frequency of oscillation Fmax that is compatible with the integrator/comparator module 150. The output voltage Vout stabilizes at a corresponding voltage, which indicates that the current at the primary winding is very high or outside the measurement range of the device.

For example, the protection means consist of means 193, 195 for measuring the frequency of the oscillator 132 as illustrated in FIG. 19. Thus, it is possible to check whether the oscillator 132 functions within the frequency range provided by design. For example, it is ensured that the frequency remains within a range by more or less 25%. FIG. 19 corresponds to the variant of FIG. 15, in which the inductor 196 is replaced by the transistor 193 and the resistor 195.

The measuring means may comprise a transistor 193 of which the grid voltage corresponds to the voltage at the terminals of the resistor 160 connected between ground and the non-inverting input of the operational amplifier 156 of the oscillator 132. The drain of the transistor 193 is connected by a resistor 195 to a power supply.

This power supply for example is the same power supply Vsup used by the voltage range adjustment device 194.

The transistor 193 may be a MOSFET transistor. The drain-source voltage of the transistor 193 corresponds to the frequency Fout of the oscillator 132.

The maximum oscillation frequency is dependent inter alia on the magnetic material of the toroid 128, on the number of turns of the secondary winding 130 and on the current at the primary winding.

The invention further relates to a continuous component detection system comprising the device 100 for detecting leakage current according to the invention and the means 214 for detecting a continuous component in the leakage current.

The means 214 for detecting a continuous component may assure the detection of the passing of a threshold by a minimum of the signal delivered by the measuring means 124.

For example, on the basis of the signal delivered by the measuring means 124 of the detection device 100, the means 214 for detecting a continuous component can check whether the current measured at the primary winding 127 passes via zero at least once per period, the period being determined for example by the frequency of the sector to which the circuit 103 of the vehicle 102 is connected.

If this is not the case, that is to say if the current does not pass via zero, the means 214 for detecting a continuous component measure how many times the minimum value of the current measured deviates from zero. This minimum value must be lower than a predetermined threshold Is, determined for example by currently enforced standards, in particular a threshold of a value of 6 mA. If not, the detection means 214 indicate the presence of a continuous component in the conductive element 127, that is to say in the leakage current.

For example, said means 214 for detecting a continuous component may comprise a voltage comparator comparing the voltage Vout delivered by the detection device 100 with a reference voltage. If the voltage Vout delivered by the detection device 100 is greater than said reference voltage, the detection means 214 indicate the presence of a continuous component in the conductive element 127.

Said detection system is configured to detect currents with a predetermined threshold Is of which the value may reach 100 mA, in particular 30 mA, more particularly 6 mA, moreover with an error of approximately, or even less than, 1 mA. For greater intensities, the device functions at its maximum measuring value.

The invention also relates to an electric system for protecting the charging of a battery installed in a vehicle, in particular a motor vehicle.

The protection system will be described with reference to an application illustrated in FIG. 16.

Said electric circuit 103, here, is a battery charger and comprises in series an AC to DC converter, in particular a rectifier 204, and a DC to DC converter, in particular a voltage step-up converter 206. The rectifier 204 is connected to the supply line 107, in particular by a start-up current limiter 208. The step-up voltage converter 206 is connected to the battery to be charged, in particular by an output filter 210. A decoupling capacitor 212 could be inserted between the rectifier 204 and the voltage step-up converter 206.

It is noted that an input filter 202 could be inserted on the supply line 107 in series with the connector 106.

The protection system according to the invention comprises a system for detecting a leakage current as described above and control means 200 intended to control the electric circuit 103.

The continuous component detection means 214 deliver a signal indicating the absence or the presence of a continuous component to a unit 201 delivering adapted signals to the electric circuit 103.

When the detection system indicates the presence of a continuous component in the leakage current, said control means 200 of the electric protection system make it possible, for example, to operate the voltage converter or rectifier 204, serving to charge the battery, in degraded mode. More precisely, said control means 200 could be configured to transmit an order to open all or some of the switches, in particular the transistors, serving for the conversion of current in the rectifier 204.

Even more precisely, said control means can be configured to reduce the charging function by modifying the control of the switches of the converter so that they stop making the power factor correction. In other words, the charging of the battery is not stopped, that is to say the current delivered by the network is not interrupted, but is continued only partially, in particular in the measurement necessary in order to still conform to the constraints imposed by the network.

The charging of the battery can thus be modified by eliminating the probable source of the current comprising a continuous component detected by said detection system, as explained with reference to FIGS. 7 and 8. Said control means 200 may even stop the charging of the battery.

The invention will be better understood with reference to FIGS. 17a to 17c, which show the variations of an alternating current at the primary winding 127 as a function of time in accordance with a curve 300. The currents shown in these figures have the same amplitude ΔI=Imax−Imin.

In FIG. 17a, the current at the primary winding is of zero mean Im and does not have a continuous component. The toroid 128 is in its neutral magnetic state and the device for detecting a leakage current 100 also delivers a signal of zero mean. The control means 200 of the protection system allow the battery to be charged in a nominal manner.

In FIG. 17b, the current at the primary winding is no longer of zero mean. However, although the mean Im of the current is greater than the predetermined threshold Is, the minimum value of the current Imin remains below said threshold Is. The toroid 128 is no longer in its neutral magnetic state and the device for detecting leakage current also delivers a signal of non-zero mean, but of which the minimum Imin is sufficiently low. It is believed that such a situation does not prevent the circuit breaker of the domestic installation to which the vehicle is recorded from functioning. The control means 200 thus still allow the battery to be charged in a nominal manner.

By contrast, in FIG. 17, the minimum value Imin of the current is passed above the predetermined threshold Is. It is thus believed that such a situation is dangerous. The control means 200 then command a mode of degraded charging of the battery or stop the charging of the battery.

Thanks to the protection system, the vehicle is itself sufficient for protecting individuals passing in the proximity of said vehicle as well as the occupants of the dwelling to which the vehicle is connected for recharging the battery, even in the case of the presence of a continuous component in the current circulating between the vehicle and the domestic installation. In fact, thanks to said measuring means 124, which are installed in the vehicle, it is possible to detect dangerous configurations and implement the suitable measures, whatever the type of circuit breaker fitted in said domestic installation.

The control means 200 could be integrated in the electric circuit 103 of the vehicle. Said continuous component detection system and said control means 200 of the protection system for charging the battery are then connected, in particular, by means of the cable 122 connecting said electric circuit 103 and said device for detecting a leakage current 100.

Said continuous component detection means 214 can be included in the control means 200. Said continuous component detection means 214 are then connected to the output terminal 170, 170' of said detection device 100, for example by the cable 122 assuring the connection between the electric circuit 103 of the vehicle and said detection device 100. Alternatively, these continuous component detection means 214 can be included in the measuring device 100. This makes it possible to reduce the workload of the control means 200. Said protection device is then configured so that said information concerning the presence of a continuous component in the leakage current is delivered from the detection device 100 to the control means 200, which may then possibly trigger the degraded charging mode of the battery depending on said presence information.

If FIG. 9 is consulted again, the invention also relates to a system for measuring the ground impedance of the domestic installation 104 serving to charge the motor vehicle battery 102. Said measuring system comprises a device 100 for detecting a leakage current as described above.

Said detection device 100 is then configured, for example, to give a measurement in a neutral conductor of the supply cable 107 supplying the electric circuit 103 of the vehicle.

Said measuring system comprises means for measuring the voltage between said neutral conductor and the ground of the domestic installation 104. Thanks to the measurement of current performed by the detection device 100, it is then possible to deduce the value of the ground impedance by means of Ohm's law by comparing the measured voltage and the measured (ground) current.

Said measuring system could also comprise means for measuring the voltage between the neutral and the chassis of the vehicle. The impedance that can be deduced by Ohm's law then also comprises the impedance of the chassis.

Said system for measuring the ground impedance could also comprise a power supply able to provoke a test current having a continuous component in said supply cable 108.

Of course, the invention is not limited to the described examples.

In particular, the invention applies to a motor having a number of phases.

In addition, the invention has been described with measuring means 124 measuring a current circulating in a conductive element 127. However, the means 124 can measure a resultant current. In this case, the toroid 128 is passed through by a number of conductive elements, which produce this resultant current.

In particular, the electric circuit 103 is an H-bridge inverter/charger, for example such as the device disclosed in French patent applications FR2938711 or FR2944391 in the name of the applicant, of which the content is incorporated in the present application.

FIG. 17c illustrates an example in which the criterion making it possible to determine whether the current at the primary winding (that is to say from the circuit 103) has a continuous component that causes a residual-current circuit breaker 11 of a dwelling to fail lies in determining when the minimum value Imin of the current at the primary winding is greater than a predetermined threshold Is. However, there are other criteria. For example, the presence of a continuous current that causes the residual-current circuit breaker 11 to fail could be highlighted when the ratio between a continuous component of the current from the circuit 103 and an alternating component of the same current is greater than a predetermined threshold.

The invention claimed is:

1. A device for detecting a leakage current, comprising:
a circuit for measuring a current from an electric circuit of a motor vehicle, said detection device being installed in said vehicle, the measuring circuit comprising:
a magnetic toroid configured to be passed through by one or more conductive elements through which said current from the electric circuit is passed, said conductive element or elements forming a primary winding;
a secondary winding, wound around said toroid, for generating a magnetic flux on the basis of a reference current;
an oscillator for generating the reference current through the secondary winding, the reference current being configured to saturate said toroid;
an inductor for protecting the functioning of the oscillator;
an integrator/comparator module configured to deliver a current, referred as the image of the current at the primary winding, which is dependent on the current from the circuit; and
means for compensating for the flux generated by the current from the electric circuit based on the current delivered by said integrator/comparator module, wherein the flux compensation means comprise a third winding wound around said toroid, and wherein an output of said integrator/comparator module is connected to said third winding such that said third winding is passed through by said current that is the image of the current at the primary winding,
wherein the value of the current of the primary winding is obtained on the basis of the mean value of the current at the secondary winding over a period of oscillation covering a complete toroid magnetization and demagnetization cycle.

2. The device as claimed in claim 1, wherein the flux compensation means are formed by said secondary winding, and wherein an output of said integrator/comparator module is connected to said secondary winding such that said secondary winding is passed through by said current that is the image of the current at the primary winding.

3. The device as claimed in claim 2, wherein said measuring circuit comprises a parameterizing resistor having a first terminal connected to the secondary winding and to the oscillator and a second terminal connected to an output terminal of the device and to the integrator/comparator module so as to adjust the output characteristics of the device and the characteristics of the oscillator.

4. The device as claimed in claim 2, wherein said measuring circuit comprises an adjusting resistor having a first terminal connected to the secondary winding and to the oscillator and a second terminal connected to a ground of said device so as to adjust the characteristics of the oscillator.

5. The device as claimed in claim 3, wherein said measuring circuit comprises a measuring resistor having a first terminal connected to the secondary winding and a second terminal connected to an output terminal of the device and to the integrator/comparator module so as to adjust the output characteristics of the device.

6. The device as claimed in claim 1, wherein the measuring circuit comprises a filter module for filtering said current that is the image of the current at the primary winding, thus making it possible to obtain a signal having a profile substantially identical to that of the current from the electric circuit.

7. The device as claimed in claim 6, wherein the measuring circuit comprises a voltage range adjustment device for adjusting the voltage range at the output of the filter module.

8. The device as claimed in claim 1, further comprising a generator of fictitious ground, said measuring circuit-being connected to said fictitious ground.

9. The device as claimed in claim 8, wherein said oscillator and/or said generator of fictitious ground and/or said integrator/comparator module comprise at least one respective operational amplifier.

10. The device as claimed in claim 9, wherein said operational amplifier is such that its transition time is less than 50 ns.

11. The device as claimed in claim 9, wherein said operational amplifier is connected at the output to a current amplifier.

12. An electric system for protecting the charging of a battery installed in a motor vehicle, comprising a device for detecting a leakage current as claimed in claim 1.

13. The electric protection system as claimed in claim 12, comprising control means for controlling a circuit serving to charge said battery operating in a degraded mode.

14. A system for measuring a ground impedance of a domestic installation serving to charge a battery of a motor vehicle, said measuring system comprising a device for detecting a leakage current as claimed in claim 1.

15. A system for charging a battery installed in a motor vehicle comprising an electric protection system for protecting the charging of a battery installed in the motor vehicle and a system for measuring a ground impedance of a domestic installation serving to charge the battery, both of which comprise a device for detecting a leakage current as claimed in claim 1.

16. A method for charging a motor vehicle battery, comprising:
the provision of a charging system as claimed in claim 15;
the charging of the battery with a power factor correction by means of said charging system; and the continuance of the charging without the power factor correction when a ratio between a continuous component of the leakage current and an alternating component of this leakage current is greater than a predetermined threshold.

* * * * *